(12) United States Patent
Yoshida et al.

(10) Patent No.: US 12,131,925 B2
(45) Date of Patent: Oct. 29, 2024

(54) SUBSTRATE MAPPING DEVICE, METHOD OF MAPPING BY THE DEVICE, AND METHOD OF TEACHING THE MAPPING

(71) Applicant: Kawasaki Jukogyo Kabushiki Kaisha, Kobe (JP)

(72) Inventors: Masaya Yoshida, Kobe (JP); Shinya Kitano, Kobe (JP); Hiroyuki Okada, Kobe (JP); Ippei Shimizu, Kobe (JP)

(73) Assignee: KAWASAKI JUKOGYO KABUSHIKI KAISHA, Kobe (JP)

( * ) Notice: Subject to any disclaimer, the term of this patent is extended or adjusted under 35 U.S.C. 154(b) by 332 days.

(21) Appl. No.: 17/622,238

(22) PCT Filed: Apr. 3, 2020

(86) PCT No.: PCT/JP2020/015375
§ 371 (c)(1),
(2) Date: Dec. 23, 2021

(87) PCT Pub. No.: WO2020/261698
PCT Pub. Date: Dec. 30, 2020

(65) Prior Publication Data
US 2022/0351994 A1    Nov. 3, 2022

(30) Foreign Application Priority Data
Jun. 27, 2019  (JP) .................................. 2019-119637

(51) Int. Cl.
*H01L 21/67* (2006.01)
*G01B 11/25* (2006.01)
(Continued)

(52) U.S. Cl.
CPC .... *H01L 21/67259* (2013.01); *G01B 11/2518* (2013.01); *G05B 19/421* (2013.01);
(Continued)

(58) Field of Classification Search
CPC ......... H01L 21/67265; H01L 21/67772; H01L 21/68707; H01L 21/67259;
(Continued)

(56) References Cited

U.S. PATENT DOCUMENTS

2003/0085368 A1\* 5/2003 Kesil .................. G01V 8/12
250/559.36
2007/0118300 A1\* 5/2007 Mollenkopf ...... H01L 21/67265
702/33
(Continued)

FOREIGN PATENT DOCUMENTS

CN      105097592 A     11/2015
CN      109755166 A  *  5/2019
(Continued)

*Primary Examiner* — Michael P Stafira
(74) *Attorney, Agent, or Firm* — XSENSUS LLP

(57) ABSTRACT

A substrate mapping device 4 maps a plurality of substrates 10 inside a container where the substrates 10 are accommodated so as to be arrayed in a given arrayed direction. The substrate mapping device 4 includes a sensor 16 configured to detect a state of the substrate 10, a manipulator 14 configured to move the sensor 16, and a control device 18 configured to control the manipulator 14 to move the sensor 16 along a mapping course. The control device 18 sets a first mapping position and a second mapping position different in the position in the arrayed direction of the substrates 10 from the first mapping position, and sets the mapping course based on the first mapping position and the second mapping position.

7 Claims, 9 Drawing Sheets

(51) Int. Cl.
*G05B 19/421* (2006.01)
*H01L 21/687* (2006.01)
*B25J 11/00* (2006.01)
*B25J 19/02* (2006.01)

(52) U.S. Cl.
CPC ..... *H01L 21/68707* (2013.01); *B25J 11/0095* (2013.01); *B25J 19/021* (2013.01)

(58) Field of Classification Search
CPC ......... H01L 21/67766; H01L 21/67778; H01L 21/67271; H01L 21/67276; H01L 21/67727; H01L 21/681; H01L 21/68742; H01L 21/6875; H01L 21/677; H01L 21/324; H01L 21/67763; H01L 21/67781; H01L 21/67775; H01L 21/68; H01L 21/67098; H01L 21/67288; H01L 21/67742; H01L 21/67294; H01L 21/673; H01L 21/67346; H01L 21/6773; G01B 11/00; G05B 2219/37415; G05B 2219/39536; G05B 2219/45057; G05B 19/402; G05B 2219/37608; G05B 2219/40562; B25J 9/1612; B25J 9/163; B25J 9/1697; B25J 11/0095; B25J 9/042; B25J 9/1015; B25J 9/106
See application file for complete search history.

(56) References Cited

U.S. PATENT DOCUMENTS

| | | | |
|---|---|---|---|
| 2015/0308812 A1* | 10/2015 | Natsume | H01L 21/67265 356/612 |
| 2016/0318182 A1* | 11/2016 | Nakaya | B25J 9/1697 |
| 2018/0068881 A1* | 3/2018 | Cavins | H01L 21/67766 |

FOREIGN PATENT DOCUMENTS

| | | | | |
|---|---|---|---|---|
| JP | 2000124289 A | * | 4/2000 | |
| JP | 2008147583 A | * | 6/2008 | |
| JP | 2014-75397 A | | 4/2014 | |
| JP | 2015050410 A | * | 3/2015 | |
| JP | 2017174899 A | * | 9/2017 | |
| JP | 2018029210 A | * | 2/2018 | ......... G01B 11/002 |
| KR | 20040074743 A | * | 8/2004 | |
| KR | 100490203 B1 | * | 5/2005 | |
| KR | 100642517 B1 | * | 11/2006 | |
| KR | 20070009077 A | * | 1/2007 | |
| KR | 10-2009-0026880 A | | 3/2009 | |
| KR | 20100054554 A | * | 5/2010 | |
| KR | 20110062522 A | * | 6/2011 | |
| KR | 20120119677 A | * | 10/2012 | |
| WO | WO-2004009862 A2 | * | 1/2004 | ............ B65G 49/00 |
| WO | 2016/178300 A1 | | 11/2016 | |

* cited by examiner (A)

(B)

(A)

(B)

(A)

(B)

SUBSTRATE MAPPING DEVICE, METHOD OF MAPPING BY THE DEVICE, AND METHOD OF TEACHING THE MAPPING

CROSS-REFERENCE TO RELATED APPLICATIONS

The present application is based on PCT filing PCT/JP2020/015375, filed Apr. 3, 2020, which claims priority to JP 2019-119637, filed Jun. 27, 2019, the entire contents of each are incorporated herein by reference.

TECHNICAL FIELD

The present disclosure relates to a substrate mapping device, a mapping method using the substrate mapping device, and a method of teaching the mapping.

BACKGROUND ART

In manufacture of substrates, such as semiconductor wafers, the substrates are transferred between processes while being accommodated in a container. This container is provided with a plurality of slots for holding the substrates, respectively. At each process, a substrate is taken out from the slot and a given processing is applied to the substrate.

Prior to the taking out of the substrate, the existence of a substrate of each slot is detected using a mapping sensor. According to this detection, the plurality of substrates arranged in the container are mapped. After the mapping, the substrate is taken out from the container.

Patent Document 1 (WO2016/178300A1) discloses one example of a transfer robot which also serves as the substrate mapping device provided with such a mapping sensor. This mapping sensor is disposed at a pair of finger parts of a hand. The mapping sensor detects a substrate which passes between the pair of finger parts.

REFERENCE DOCUMENT OF CONVENTIONAL ART

Patent Document

[Patent Document 1] WO2016/178300A1

DESCRIPTION OF THE DISCLOSURE

Problem to be Solved by the Disclosure

The mapping by the transfer robot sets one reference position. Based on the reference position, the transfer robot moves the mapping sensor in the up-and-down direction in which the substrates are arrayed. The substrates are detected by the mapping sensor. Thus, the substrates accommodated in the container are mapped.

The direction in which the substrates accommodated in the container are arrayed may incline to the up-and-down direction of the transfer robot. For example, it is a case where the table on which the container is placed inclines to the transfer robot. In this case, in the mapping sensor which moves vertically, a relative spatial relationship between the mapping sensor and the detected substrate changes. This change in the relative spatial relationship becomes factors of an erroneous detection of the substrate state, and interference between the substrate and the hand. This change in the relative spatial relationship reduces the detection accuracy of the substrate.

One purpose of the present disclosure is to provide a substrate mapping device, a method of mapping by the substrate mapping device, and a method of teaching the mapping, which excel in a detection accuracy of a substrate.

SUMMARY OF THE DISCLOSURE

A substrate mapping device according to the present disclosure maps a plurality of substrates inside a container where the substrates are accommodated so as to be arrayed in a given arrayed direction. The substrate mapping device includes a mapping sensor configured to detect a state of the substrate, a manipulator configured to move the mapping sensor, and a control device configured to control the manipulator to move the mapping sensor along a mapping course. The control device sets a first mapping position and a second mapping position different in the position in the arrayed direction from the first mapping position, and sets the mapping course based on the first mapping position and the second mapping position.

A method of mapping substrates according to the present disclosure uses a substrate mapping device provided with a mapping sensor configured to detect a state of the substrate, a manipulator configured to move the mapping sensor, and a control device configured to control the manipulator to move the mapping sensor along a mapping course. The method includes the steps of (A) placing, on a table, a container where the plurality of substrates are accommodated so as to be arrayed, (B) obtaining, by the control device, a first mapping position and a second mapping position different from the first mapping position in the position in an arrayed direction of the substrates in the container placed on the table, (C) setting, by the control device, the mapping course based on the first mapping position and the second mapping position, and (D) mapping, by the control device, the substrates accommodated in the container by moving the mapping sensor along the mapping course.

Preferably, the hand is holdable of the substrate. The obtaining the first mapping position and the second mapping position may include obtaining a first reference position and a second reference position different from the first reference position in the position in the arrayed direction, that are reference positions for the hand to hold the substrate accommodated in the container, and calculating the first mapping position based on the first reference position and calculating the second mapping position based on the second reference position.

A method of teaching mapping of substrates according to the present disclosure uses a substrate mapping device provided with a mapping sensor configured to detect a state of the substrate, a manipulator configured to move the mapping sensor, and a control device configured to control the manipulator to move the mapping sensor along a mapping course. The method includes the steps of (A) placing, on a table, a container where a plurality of substrates are accommodated so as to be arrayed, (B) obtaining, by the control device, a first mapping position and a second mapping position different from the first mapping position in the position in an arrayed direction of the substrates in the container placed on the table, and (C) setting, by the control device, the mapping course based on the first mapping position and the second mapping position.

Effect of the Disclosure

In the substrate mapping device according to the present disclosure, the mapping course is set based on the first mapping position and the second mapping position. The arrayed direction in which the substrates are lined up can be identified based on the first mapping position and the second mapping position which differ in the position. Even when the arrayed direction of the substrates is inclined, the state of the substrates is detected along this arrayed direction. In the arrayed direction, a change of a relative spatial relationship between the substrate and the mapping sensor is suppressed. The substrate mapping device excels in a detection accuracy of the substrate state, as well as the method of mapping and the method of teaching the mapping using this substrate mapping device can improve the detection accuracy of the substrate state.

MODE FOR CARRYING OUT THE DISCLOSURE

Figure 1:
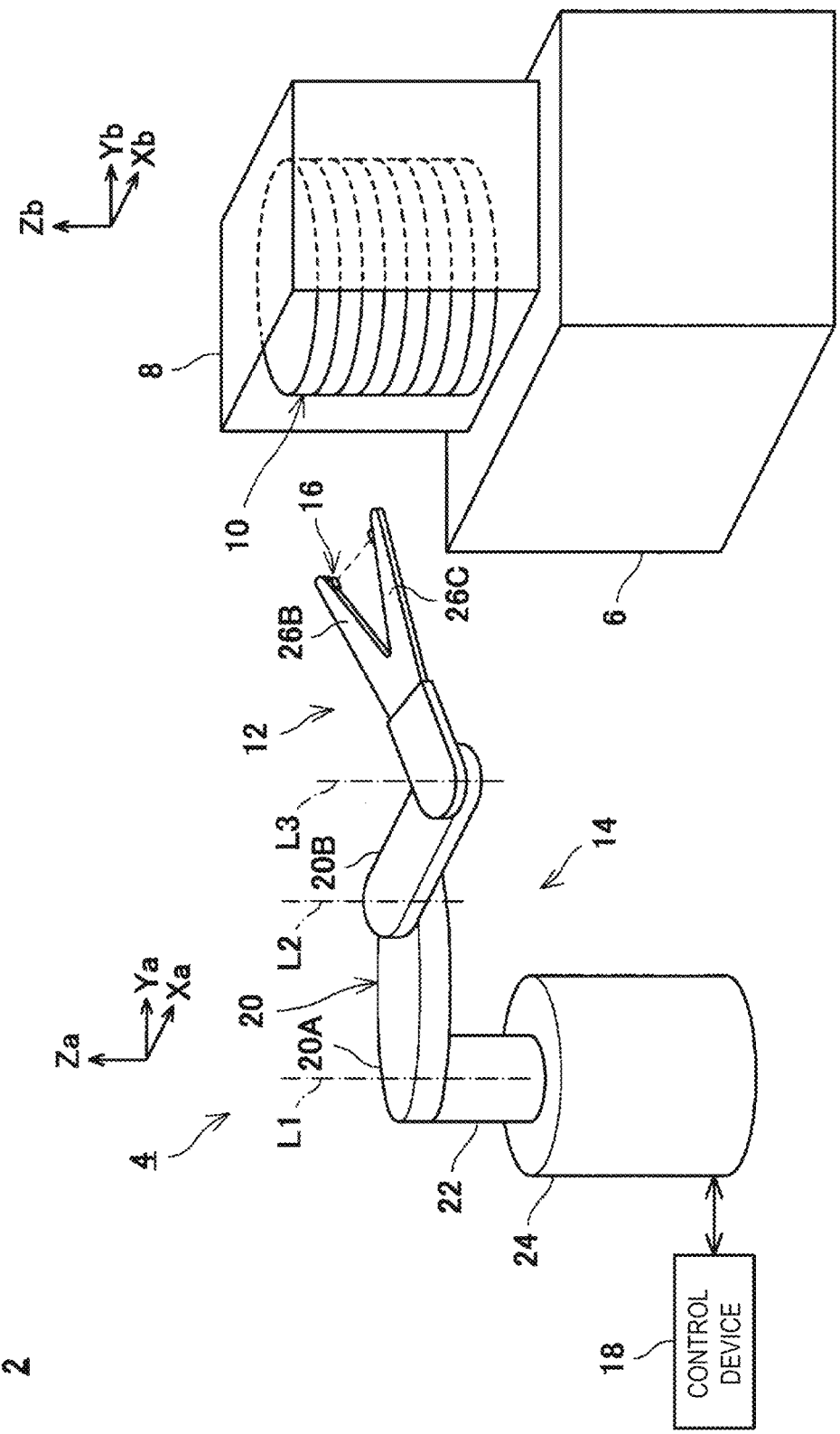
FIG. 1 is a schematic view of a substrate mapping device and a substrate processing equipment provided with the device, according to one embodiment according to the present disclosure.

Hereinafter, the present disclosure is described in detail based on a desirable embodiment, while suitably referring to the drawings.

Substrate processing equipment 2 of FIG. 1 includes a substrate transferring device 4 which also serves as a substrate mapping device of the present disclosure, a table 6, and a container 8. An arrow Xa of FIG. 1 indicates the rightward in the left-and-right direction of the substrate transferring device 4, an arrow Ya indicates the forward in the front-and-rear direction, and an arrow Za indicates the upward in the up-and-down direction. Further, an arrow Xb indicates the rightward of the table 6 in left-and-right direction, an arrow Yb indicates the forward in the front-and-rear direction, and an arrow Zb indicates the upward in the up-and-down direction.

The table 6 is fixed to a floor (not illustrated), for example. The container 8 is placed on the table 6. The container 8 is positioned at a given position on the table 6. The left-and-right direction, the front-and-rear direction, and the up-and-down direction of the container 8 are defined by the left-and-right direction, the front-and-rear direction, and the up-and-down direction of the table 6. In this embodiment, the left-and-right direction, the front-and-rear direction, and the up-and-down direction of the container 8 are in agreement with the left-and-right direction, the front-and-rear direction, and the up-and-down direction of the table 6. A plurality of substrates 10 are accommodated in the container 8.

The substrate 10 is a semiconductor substrate or a glass substrate, for example. This substrate 10 is a circular thin plate, for example. This substrate 10 includes a pair of circular principal surfaces 10A, and an outer circumferential surface between the pair of principal surfaces 10A. This substrate 10 is a thin plate, and, for example, it may be a polygonal thin plate. The semiconductor substrate includes a silicon substrate, a sapphire (single crystal alumina) substrate, and various kinds of other substrates. The glass substrate includes a glass substrate for a FPD (Flat Panel Display) and a glass substrate for MEMS (Micro Electro Mechanical Systems).

The substrate transferring device 4 includes a hand 12, a manipulator 14, and a sensor 16 as one example of the mapping sensor, and a control device 18. Here, a horizontal articulated robot is used as the manipulator 14. Note that the manipulator 14 according to the present disclosure is not limited to the horizontal articulated robot. The manipulator 14 may be based on a vertical articulated robot. The manipulator 14 may be based on a prismatic joint robot provided with a linear-movement mechanism which moves the hand 12 in the front-and-rear direction (Ya direction).

The manipulator 14 includes an arm 20, an elevating shaft 22, and a base 24. In this manipulator 14, the arm 20 is provided with a first arm 20A and a second arm 20B.

The base 24 is fixed to a floor (not illustrated), for example. The elevating shaft 22 is provided to an upper part of the base 24. The elevating shaft 22 is movable in the up-and-down direction with respect to the base 24. A linear-movement actuator (not illustrated) is disposed inside the base 24. This linear-movement actuator is a drive for moving the elevating shaft 22 in the up-and-down direction. The linear-movement actuator includes, for example, a combination of a drive motor (servo motor) and a ball-screw mechanism, a linear guide, or a rack and pinion. Further, a rotation sensor for detecting a rotational position of the drive motor is disposed.

A base end of the first arm 20A is connected to the elevating shaft 22. A one-dot chain line L1 of FIG. 1 indicates an axis extending in the up-and-down direction. The first arm 20A is rotatable on the axis L1. A drive motor is disposed at the elevating shaft 22, as a drive for rotating the first arm 20A. A rotation sensor which detects a rotational position of the drive motor is disposed at the elevating shaft 22.

A base end part of the second arm 20B is connected to a tip part of the first arm 20A. A one-dot chain line L2 of FIG. 1 indicates an axis extending in the up-and-down direction. The second arm 20B is rotatable on the axis L2. A drive motor is disposed at the first arm 20A, as a drive for rotating the second arm 20B. A rotation sensor which detects a rotational position of the drive motor is disposed at the first arm 20A.

The hand 12 is connected to a tip end part of the second arm 20B. A one-dot chain line L3 of FIG. 1 indicates an axis extending in the up-and-down direction. The hand 12 is rotatable on the axis L3. A drive motor is disposed at the second arm 20B, as a drive for rotating the hand 12. A rotation sensor which detects a rotational position of the drive motor is disposed at the second arm 20B.

Figure 2:
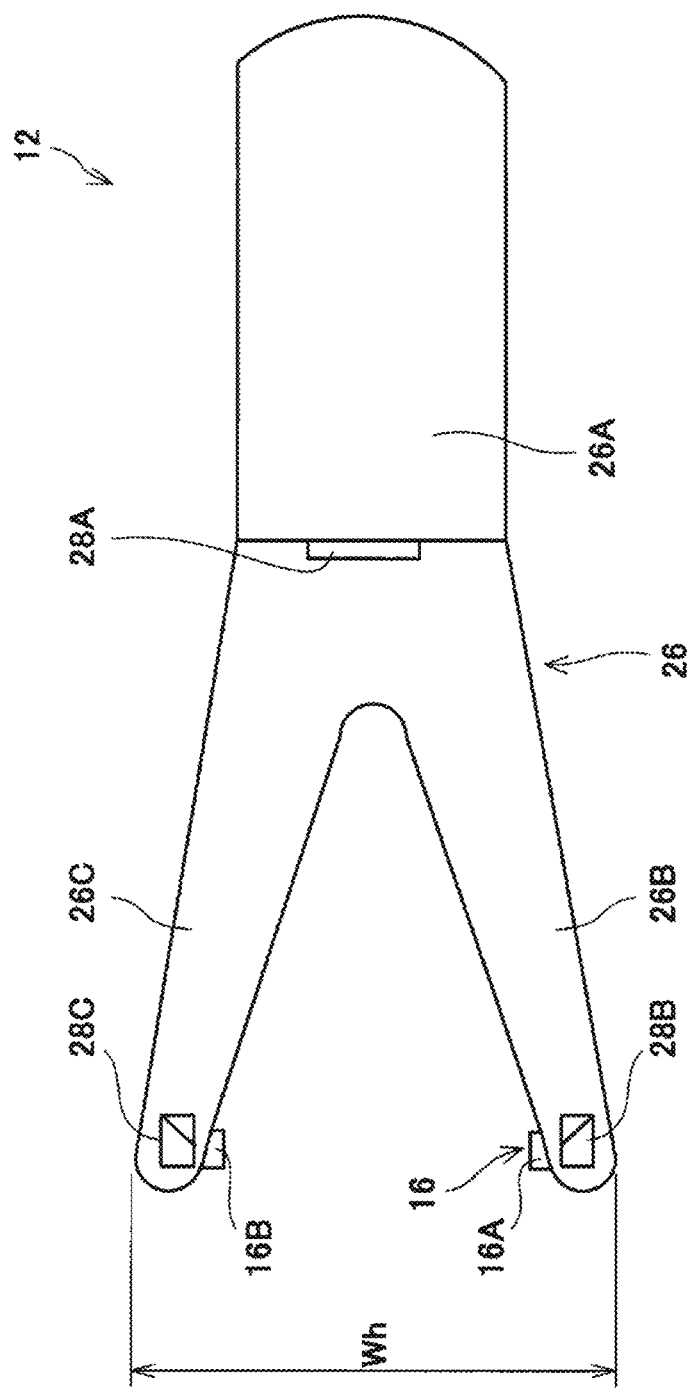
FIG. 2 is a plan view of a hand of the substrate mapping device of FIG. 1.

In FIG. 2, a plan view of the hand 12 is illustrated. The leftward in the left-and-right direction of FIG. 2 is the forward in front-and-rear direction. This hand 12 is provided with a hand body 26, a pawl 28A, a pawl 28B, and a pawl 28C. The hand body 26 has a base-end part 26A and a pair of finger parts 26B and 26C. The finger part 26B and the finger part 26C are extended forward from the base-end part 26A. This hand body 26 has a substantially Y-shape when seen from above. A two-way arrow Wh of FIG. 2 indicates a hand width of the hand 12 in the left-and-right direction. The hand width Wh is obtained as a maximum width of the hand 12 in the left-and-right direction. In this hand 12, the hand width Wh is measured as a distance from an outer end of one finger part 26B to an outer end of the other finger part 26C.

The pawl 28A, the pawl 28B, and the pawl 28C are attached to an upper surface of the hand body 26. In this hand 12, the pawl 28A is attached to the base-end part 26A, the pawl 28B is attached to the finger part 26B, and the pawl 28C is attached to the finger part 26C.

Note that, although the hand 12 having the substantially Y-shape provided with the pair of finger parts 26B and 26C is described here as one example, the shape of the hand 12 is not limited in particular.

The sensor 16 includes a light emitting part 16A and a light receiving part 16B. The light emitting part 16A and the light receiving part 16B are attached to the hand 12. The light emitting part 16A is attached to one finger part 26B, and the light receiving part 16B is attached to the other finger part 26C. The light emitting part 16A and the light receiving part 16B oppose to each other so that a space is formed between the finger part 26B and the finger part 26C. This sensor 16 is disposed so that the light receiving part 16B receives detection light emitted from the light emitting part 16A. This sensor 16 is detectable of an object between the light emitting part 16A and the light receiving part 16B when the detection light is interrupted.

Figure 3:
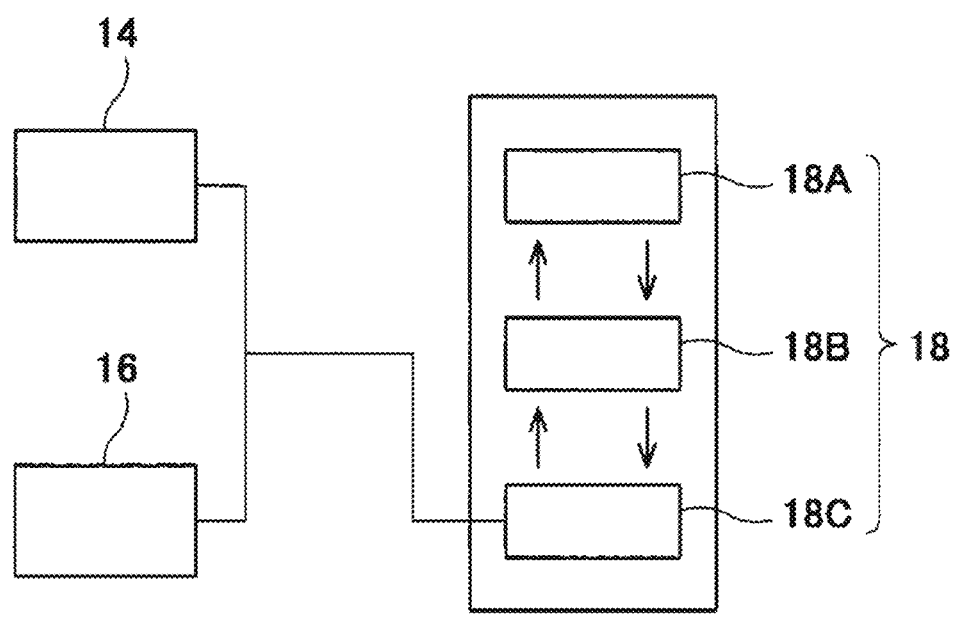
FIG. 3 is a block diagram of a control device of the substrate mapping device of FIG. 1.

As illustrated in FIG. 3, the control device 18 includes a memory 18A, a processor 18B, and an interface 18C. The memory 18A stores information on a basic program, various fixed data, etc. The memory 18A includes a ROM, a RAM, etc. The processor 18B reads and executes software, such as the basic program stored in the memory 18A. The processor 18B performs a calculation based on various data inputted from the interface 18C. The processor 18B includes a CPU. The interface 18C outputs and inputs an electrical signal between the manipulator 14, the sensor 16, etc. The interface 18C includes an interface board.

The substrate transferring device 4 may be provided with a sole control device 18 which carries out a centralized control, or may be provided with a control device 18 in which a plurality of control devices which collaboratively carry out a distributed control are combined. The control device 18 may be comprised of a microcomputer, or may be comprised of a MPU, a PLC (Programmable Logic Controller), a logical circuit, etc.

Figure 4:
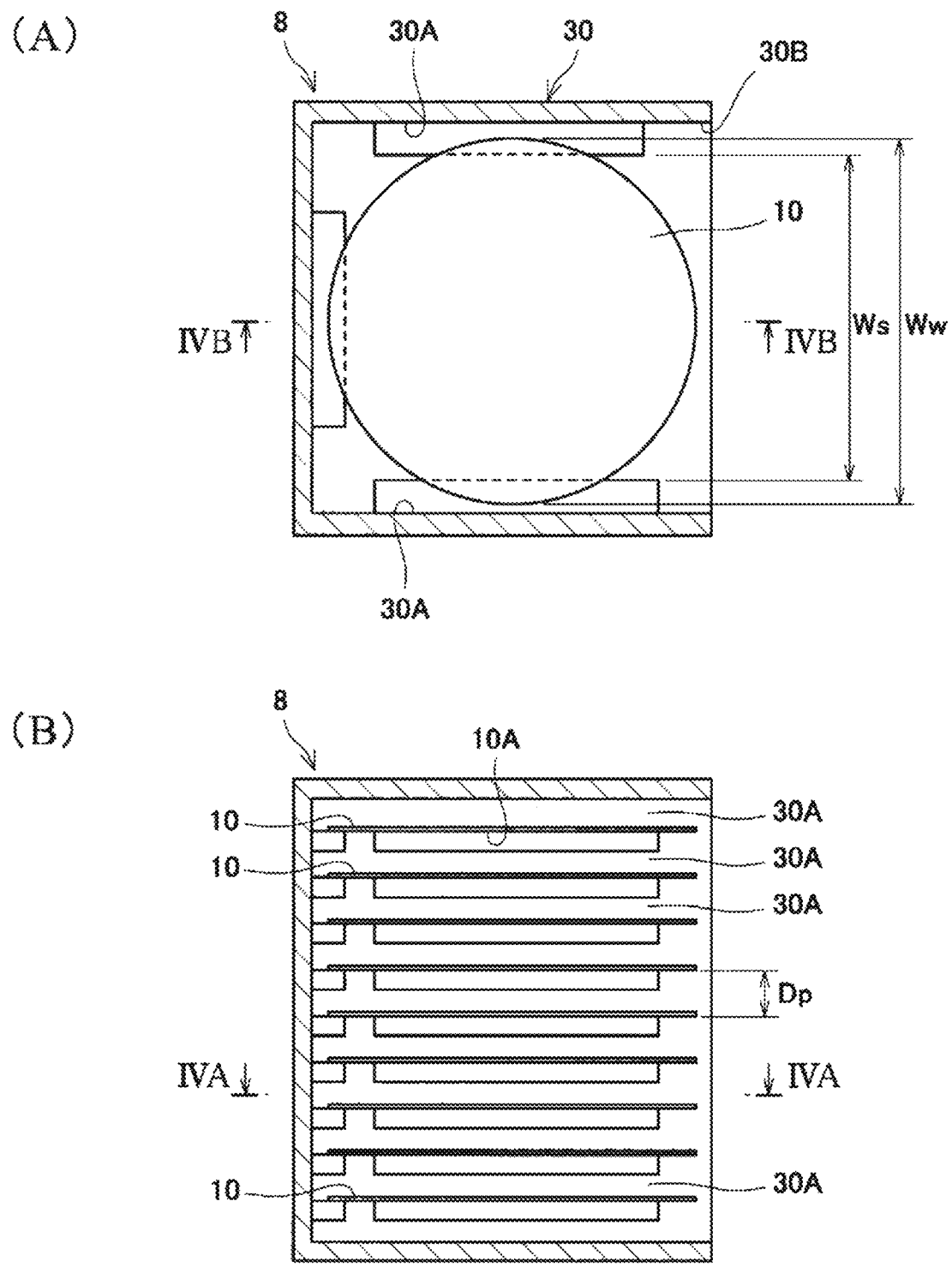
FIG. 4(A) is a cross-sectional view of a container of the substrate processing equipment, taken along a line segment IVA-IVA of FIG. 4(B)
FIG. 4(B) is a cross-sectional view of the container, taken along a line segment IVB-IVB of FIG. 4(A).

In FIGS. 4(A) and 4(B), the container 8 is illustrated together with a plurality of substrates 10. The container 8 is provided with a box-shaped shell 30. A plurality of slots 30A which are arrayed in the up-and-down direction and an opening 30B are formed in the shell 30. Each slot 30A extends vertically in the up-and-down direction. The slot 30A extends along an inner wall of the shell 30.

In FIGS. 4(A) and 4(B), the principal surface 10A of the substrate 10 is supported by the slot 30A. This slot 30A holds the substrate 10 so that its principal surface 10A becomes perpendicular to the up-and-down direction. As illustrated in FIG. 4(B), the plurality of substrates 10 are arrayed in the up-and-down direction.

A two-way arrow Ws of FIG. 4(A) indicates an inner width of the slot 30A. The inner width Ws indicates a distance from an inner end of one slot 30A to an inner end of the other slot 30A in the left-and-right direction. A two-way arrow Ww indicates a width of the substrate 10 in the left-and-right direction. This substrate 10 is a circular thin plate. Therefore, the width Ww is obtained as a diameter of the substrate 10. A two-way arrow Dp of FIG. 4(B) indicates an interval of the slots 30A. The plurality of slots 30A are formed in the container 8 at the constant interval Dp in the up-and-down direction. In this container 8, a plurality of substrates 10 are arrayed in the up-and-down direction at the constant interval Dp.

This container 8 is not limited in particular, as long as it accommodates the plurality of substrates 10 in a row and is placed on the table 6. The container 8 includes a FOUP (Front Opening Unified Pod).

Figure 5:
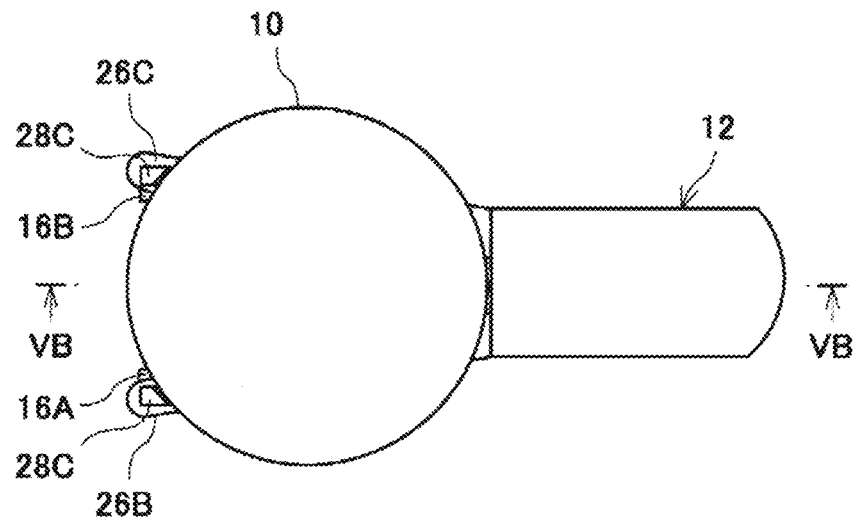
FIG. 5(A) is an explanatory view in which a flat surface in a using condition of a substrate transferring device of FIG. 1 is illustrated.
FIG. 5(B) is an explanatory view in which a cross-section taken along a line segment VB-VB of FIG. 5(A) is illustrated.
Figure 5:
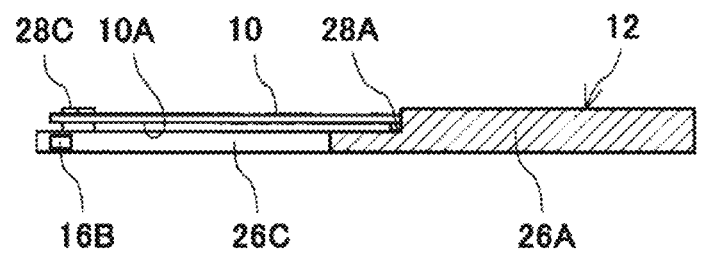

In FIGS. 5(A) and 5(B), the hand 12 holding the substrate 10 is illustrated. As described above, this substrate transferring device 4 serves both as the transferring device which transfers the substrate 10, and a mapping device which maps the substrates 10. This hand 12 is holdable of a substrate 10. In the hand 12, the principal surface 10A of the substrate 10 is supported by the pawl 28A, the pawl 28B, and the pawl 28C. The substrate transferring device 4 can use the hand 12 to take out one substrate 10 at a time from the container 8 placed on the table 6.

Note that the shapes and the locating positions of the pawl 28A, the pawl 28B, and the pawl 28C of the hand 12 are not limited in particular, as long as they are holdable of the substrate 10. The hand 12 may be provided with a large number of (four or more) pawls 28. This hand 12 is one example of a passive hand which holds the substrate 10 by using a frictional force at the contact surface, but the passive hand is not limited to this configuration. For example, the passive hand may not be provided with the pawls 28, etc, and may have a plate shape. Alternatively, instead of the pawls 28, the hand 12 may be provided with a grip-type chuck, a vacuum-type suction pad, or a Bernoulli-type suction pad, which pinches the outer circumferential surface of the substrate 10.

Figure 6:
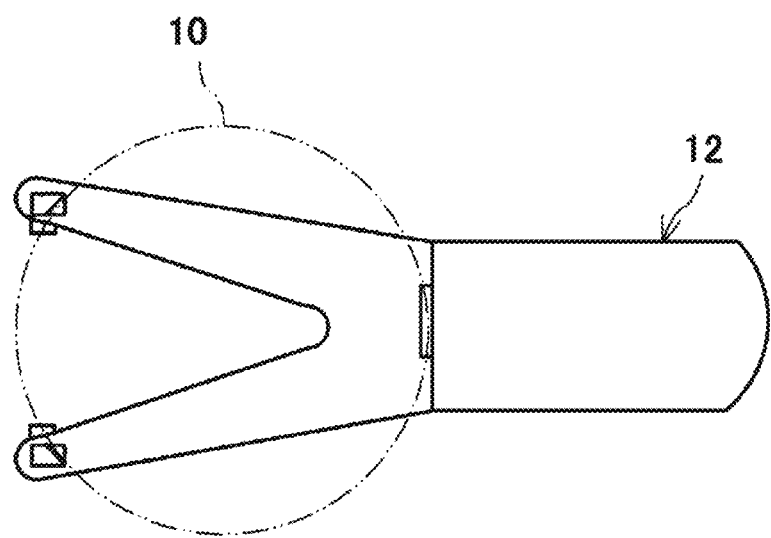
FIG. 6(A) is an explanatory view in which a flat surface in another using condition of the substrate transferring device of FIG. 1 is illustrated.
FIG. 6(B) is an explanatory view in which a side surface thereof is illustrated.
Figure 6:
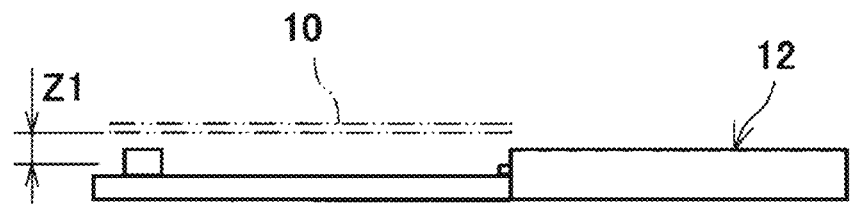

In FIGS. 6(A) and 6(B), the hand 12 located at a reference position when holding the substrate 10 is illustrated. A two-dot chain line of FIGS. 6(A) and 6(B) indicates the substrate 10 before being held. FIGS. 6(A) and 6(B) illustrate a spatial relationship between the substrate 10 and the hand 12 at the reference position. As illustrated in FIG. 6(B), the hand 12 is separated downwardly from the substrate 10 by a distance Z1, with respect to the spatial relationship between the substrate 10 and the hand 12 of FIGS. 5(A) and 5(B). The reference position is set for the substrate 10 held by the slot 30A of the container 8.

Figure 7:
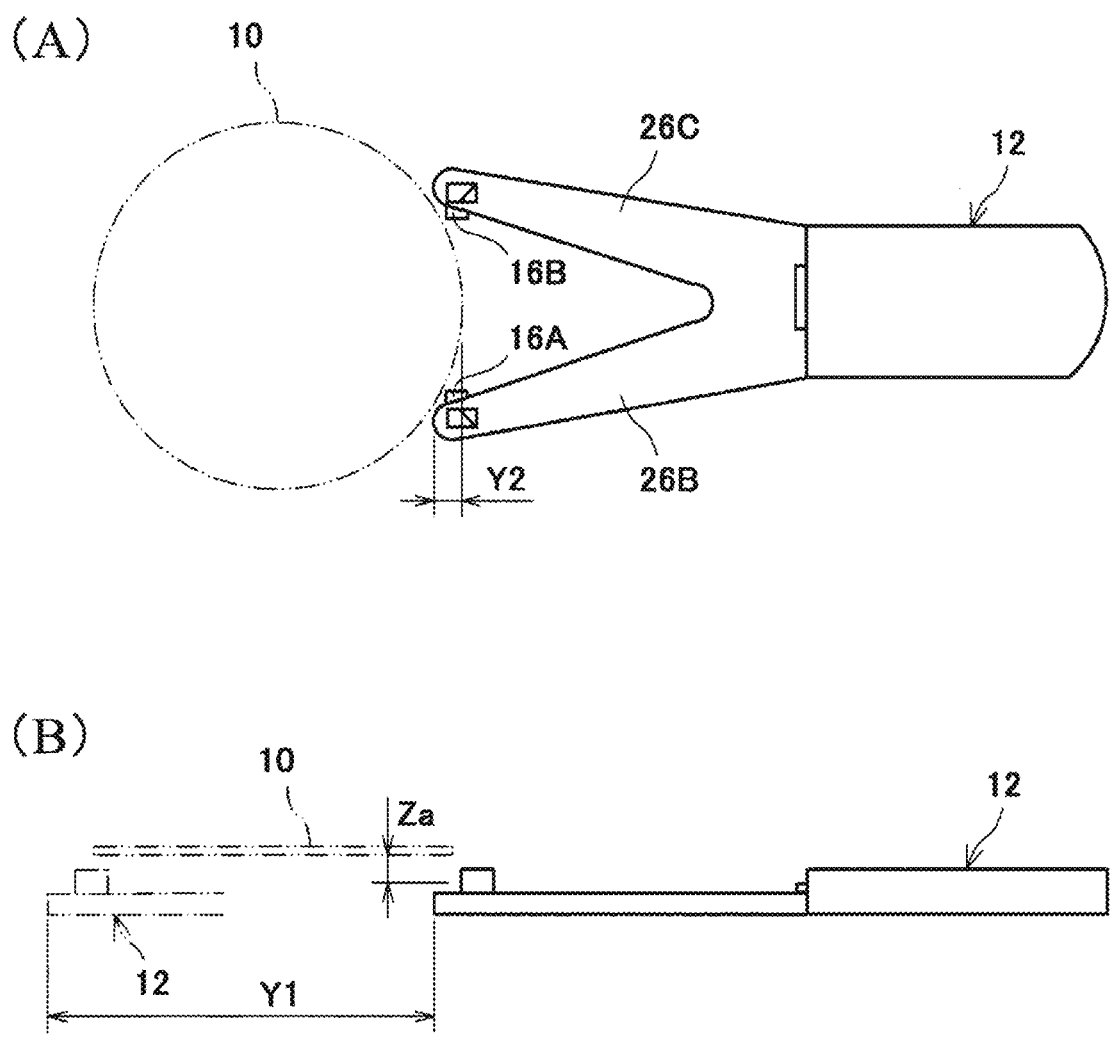
FIG. 7(A) is an explanatory view in which a flat surface in still another using condition of the substrate transferring device of FIG. 1 is illustrated.
FIG. 7(B) is an explanatory view in which the side surface thereof is illustrated.

In FIGS. 7(A) and 7(B), the hand 12 at a mapping position is illustrated. A two-dot chain line of FIGS. 7(A) and 7(B)

indicates the substrate 10 held by the slot 30A of the container 8, and a part of the hand 12 at the reference position. FIGS. 7(A) and 7(B) indicate a spatial relationship between the substrate 10 and the hand 12 at the mapping position. As illustrated in FIGS. 7(A) and 7(B), this hand 12 is separated rearwardly from the hand 12 located at the reference position of FIGS. 6(A) and 6(B) by a distance Y1. This mapping position is set based on the reference position of FIGS. 6(A) and 6(B).

A two-way arrow Y2 of FIG. 7(A) indicates an insertion distance. The insertion distance Y2 is measured as a distance from a front end of the hand 12 to a rear end of the substrate 10 in the front-and-rear direction. At the mapping position of FIG. 7(A), the substrate 10 is inserted between the finger part 26B and the finger part 26C, when seen in the up-and-down direction. In the left-and-right direction, an edge of the substrate 10 is located between the light emitting part 16A and the light receiving part 16B of the sensor 16. By the hand 12 moving upwardly from this mapping position, the substrate 10 can interrupt the detection light of the sensor 16.

Figure 8:
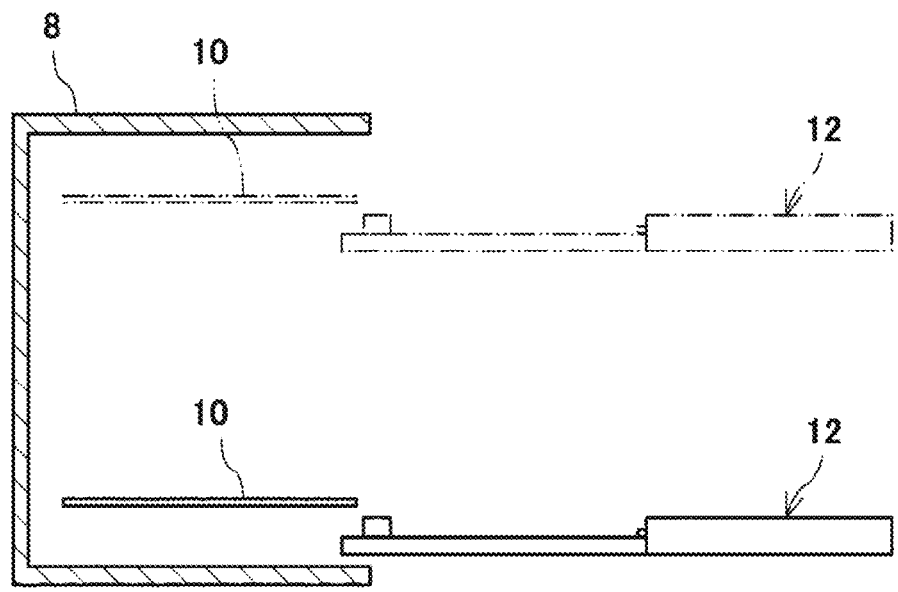
FIG. 8(A) is an explanatory view in which the side surface in still another using condition of the substrate processing equipment of FIG. 1 is illustrated.
FIG. 8(B) is an explanatory view in which the flat surface thereof is illustrated.
Figure 8:
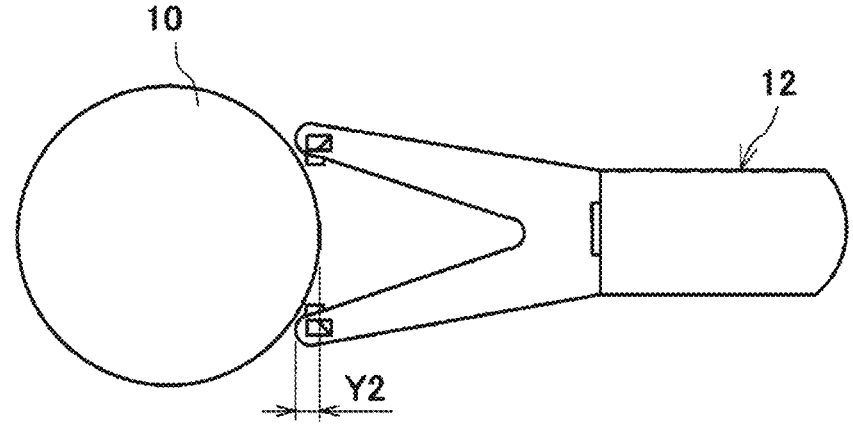

In FIGS. 8(A) and 8(B), the hand 12 at a first mapping position and the hand 12 at a second mapping position, of the present disclosure, are illustrated. In FIG. 8(A), the hand 12 at the first mapping position is illustrated by solid lines, and the hand 12 at the second mapping position is illustrated by two-dot chain lines. In FIG. 8(A), the substrate 10 held by the lowermost slot 30A of the container 8 is illustrated by solid lines, and the substrate 10 held by the uppermost slot 30A of the container 8 is illustrated by two-dot chain lines. In this first mapping position, the substrate 10 is inserted between the finger part 26B and the finger part 26C by the insertion distance Y2 in the front-and-rear direction.

This first mapping position is set based on a first reference position before holding the substrate 10 illustrated by the solid lines of FIG. 8(A). The second mapping position is set based on a second reference position before holding the substrate 10 illustrated by the two-dot chain lines of FIG. 8(A). The first reference position and the second reference position are set similarly to the reference position of FIGS. 6(A) and 6(B). The first mapping position and the second mapping position are set similarly to the mapping position of FIGS. 7(A) and 7(B).

A method of teaching the mapping of the substrates 10 using this substrate transferring device 4 is described. In this method of teaching the mapping, as illustrated in FIG. 1, the container 8 is placed on the table 6 (STEP1).

As for the container 8 placed on the table 6, the first mapping position and the second mapping position are obtained (STEP2).

At this process (STEP2), the first reference position and the second reference position are set for the container 8 placed on the table 6 (STEP2-1). Here, the first reference position and the second reference position are set as the reference position of FIGS. 6(A) and 6(B). For example, an operator locates the hand 12 at the first reference position in the lowermost slot 30A by using a teaching pendant. The control device 18 stores the first reference position. The operator locates the hand 12 at the second reference position in the uppermost slot 30A by using the teaching pendant. The control device 18 stores the second reference position.

At this process (STEP2), the first mapping position and the second mapping position are calculated in the container 8 placed on the table 6 (STEP2-2). Based on the reference position of FIGS. 6(A) and 6(B), the mapping position of FIGS. 7(A) and 7(B) is set. The control device 18 calculates the first mapping position based on the first reference position obtained at the process (STEP2-1). The control device 18 calculates the second mapping position based on the second reference position.

The control device 18 sets a mapping course by using the first mapping position and the second mapping position (STEP3). At this process (STEP3), the control device 18 sets a straight-line moving path on which the hand 12 passes through the first mapping position and the second mapping position as the mapping course, for example. The control device 18 stores the mapping course.

Next, the mapping method of the substrate 10 by using the substrate transferring device 4 is described. This mapping method includes the processes (STEP1) to (STEP3) of the method of teaching the mapping described above.

After the processes (STEP1) to (STEP3), the hand 12 is moved along the mapping course so that the substrate 10 accommodated in the container 8 is mapped (STEP4). At this process (STEP4), the container 8 which accommodates the plurality of substrates 10 is placed on the table 6. In this container 8, the accommodated substrates 10 are mapped.

In this mapping method, each time the container 8 is again placed on the table 6, the process (STEP4) is performed repeatedly. In this mapping method, the processes (STEP1) to (STEP3) may be performed for every given number of processes (STEP4) performed, or the processes (STEP1) to (STEP3) may be performed periodically.

This substrate transferring device 4 serves both as the mapping device and the transferring device. The transferring method of the substrate 10 by using this substrate transferring device 4 is described. This transferring method includes the processes (STEP1) to (STEP4) of the mapping method described above.

After the process (STEP4), one substrate 10 is taken out at a time from the container 8 by the hand 12 (STEP5). The substrate 10 is taken out based on the position of the substrate 10 which is identified by the mapping method of the present disclosure. The taken-out substrate 10 is transferred to the next process. At the next process, given processing is applied to the substrate 10 (STEP6). The substrate 10 to which the given processing is applied is returned to the container 8 (STEP7). After the given processing is applied to all the substrates 10, this container 8 is removed from the table 6 (STEP8). After that, another container 8 is placed on the table 6 (STEP9). In this transferring method, the processes (STEP4) to (STEP9) are repeatedly performed.

Figure 9:
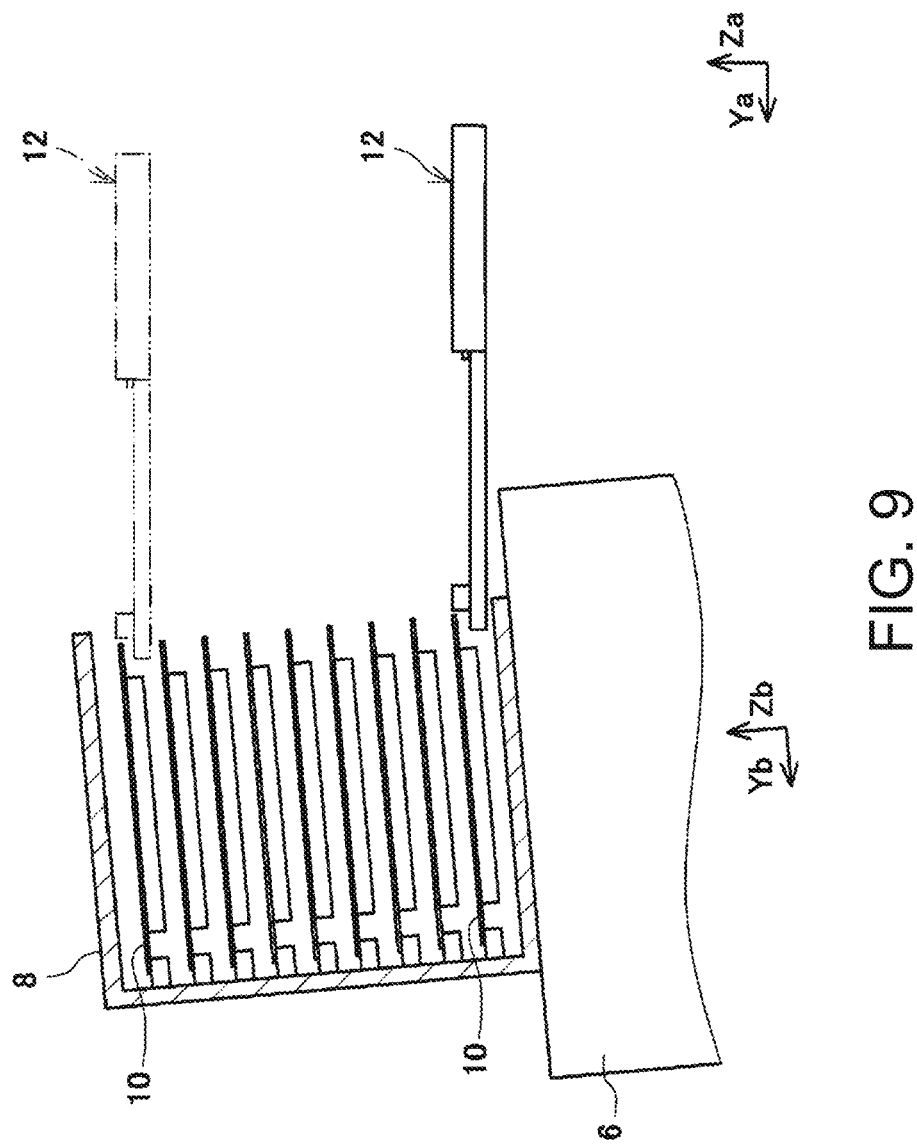
FIG. 9 is an explanatory view in which still another condition of use of the substrate processing equipment of FIG. 1 is illustrated.

A situation of the mapping using the substrate transferring device 4 is illustrated in FIG. 9. In FIG. 9, the table 6 inclines to the front-and-rear direction. The front-and-rear direction (arrow Yb) and the up-and-down direction (arrow Zb) of the table 6 and the container 8 incline to the front-and-rear direction (arrow Ya) and the up-and-down direction (arrow Za) of the substrate transferring device 4. Note that, in FIG. 9, the inclination is exaggerated in order for easier understandings.

The method of teaching the mapping is performed in this container 8. At the process (STEP4) of this mapping method, the hand 12 moves along the mapping course set by the method of teaching the mapping. The substrates 10 accommodated in the container 8 are mapped. At this process (STEP4), the control device 18 controls the hand 12 and the manipulator 14 to move the hand 12 in parallel to the up-and-down direction (arrow Zb) of the table 6 and the container 8.

In this mapping method, the hand 12 moves in the arrayed direction of the substrates 10. A deviation of the spatial relationship between the hand 12 and the substrate 10 is suppressed in the left-and-right direction and the front-andrear direction from the lowermost substrate 10 to the uppermost substrate 10. By the deviation of the spatial relationship being suppressed, a variation in the detection light which the light receiving part 16b of the sensor 16 receives becomes stable. Therefore, the mapping is stably carried out from the lowermost substrate 10 to the uppermost substrate 10. This mapping method can perform the mapping with high precision.

This mapping method can suppress an erroneous detection of the state of the substrate 10 because the deviation of the spatial relationship between the hand 12 and the substrate 10 is suppressed in the left-and-right direction and the front-and-rear direction. This mapping method can suppress interference between the substrate 10 and the hand 12. The state of the substrate 10 is not limited to the existence of the substrate 10, but includes the inclination of the substrate 10, and an overlap of the plurality of substrates 10.

In FIG. 9, although the container 8 leans to the front-and-rear direction (arrow Ya) of the substrate transferring device 4, it may lean to the left-and-right direction (arrow Xa). Further, the container 8 may lean to the left-and-right direction (arrow Xa) and the front-and-rear direction (arrow Ya) of the substrate transferring device 4.

In this mapping method, the hand 12 of the substrate transferring device 4 is capable of holding the substrate 10. This substrate transferring device 4 serves both as the transferring device of the substrate 10 and the mapping device of the substrate 10. This substrate transferring device 4 does not require the mapping device separately from the transferring device. This substrate transferring device 4 can simplify the substrate processing equipment 2.

In this mapping method, in order to transfer the substrate 10 by the hand 12, the first reference position and the second reference position are set as the reference positions when the hand 12 holds the substrate 10. The control device 18 calculates the first mapping position and the second mapping position based on the first reference position and the second reference position. In this mapping method, the first mapping position and the second mapping position are set based on the first reference position and the second reference position which are set for transferring of the substrate 10. This mapping method does not need to set the first mapping position and the second mapping position by using the teaching pendant etc. The setup of the first mapping position and the second mapping position is made easier.

Here, although the first reference position and the second reference position of the hand 12 are set below the substrate 10 by the distance Z1, with respect to the spatial relationship for the hand 12 holding the substrate 10, they are not limited to the positions. The first reference position and the second reference position of the hand 12 may be the reference positions set for holding the substrate 10 by the hand 12. For example, the position at which the hand 12 holds the substrate 10 may be the first reference position and the second reference position.

In this mapping method, the mapping course is set based on the first mapping position and the second mapping position which are different in the position in the arrayed direction of the substrates 10. The arrayed direction of the substrates 10 is identified based on the first mapping position and the second mapping position which differ in the position. By the first mapping position and the second mapping position being separated, the mapping course can be set in accordance with the arraying method of the substrates 10. From this viewpoint, preferably, based on the two positions of the substrates 10 which are separated more than the positions of the adjacent substrates 10, the first mapping position and the second mapping position are set. More preferably, the first mapping position and the second mapping position are set based on the two positions of the substrates 10 which are most distant from each other in the arrayed direction.

Further, although at the process (STEP2-1) of this mapping method the reference positions (the first reference position and the second reference position) of the hand 12 are set based on the substrates 10 accommodated in the container 8, the process is not limited to this configuration. This mapping method may be any method, as long as it can identify the arrayed direction of the substrates 10 in the container 8 placed on the table 6. At this process (STEP2-1), the reference position may be set by using a master substrate for a position adjustment of the hand 12, instead of the substrate 10. The reference position may be set based on the container 8 per se placed on the table 6. For example, different positions of the container 8 in the arrayed direction of the substrates 10 are marked. The first reference position and the second reference position may be set by detecting these marks.

This hand 12 is also used for transferring the substrate 10. This hand 12 takes out the substrate 10 placed on the slot 30A. The hand width Wh cannot be larger than the inner width Ws of the slot 30A. The hand 12 is limited in the hand width Wh. The hand 12 with the small hand width Wh is limited in the space width between the finger part 26B and the finger part 26C. This hand 12 cannot increase the insertion distance Y2 illustrated in FIG. 7(A). This substrate transferring device 4 can suppress the erroneous detection and the interference of the hand 12 with the limited insertion distance Y2. From this viewpoint, this mapping method is suitable for the substrate transferring device 4 provided with the hand 12 which is inserted in the container 8 and holds the substrate 10.

This substrate transferring device 4 is provided with the elevating shaft 22 which moves the hand 12 in the up-and-down direction. In this substrate transferring device 4, the relative positional deviation between the hand 12 and the substrate 10 is large in the left-and-right direction and the front-and-rear direction, compared with what moves the container 8 in the up-and-down direction by the table 6. This mapping method can suppress the erroneous detection due to the relative positional deviation. From this viewpoint, this mapping method is suitable for the substrate transferring device 4 provided with the elevating shaft 22 which moves the hand 12 in the up-and-down direction.

Although in this substrate transferring device 4 the sensor 16 is attached to the hand 12, the installation of the sensor 16 is not limited to this configuration. This sensor 16 may be attached movably along the mapping course. Although not illustrated, for example, a support frame extending from the base-end part 26A illustrated in FIG. 5(B) so as to be separately from the pair of finger parts 26B and 26C, is formed, and the sensor 16 may be attached to this support frame.

Further, a support frame which is separated from the hand 12 may be provided, and this support frame may be attached to the manipulator 14. The sensor 16 may be attached to the manipulator 14 via the support frame. Alternatively, the sensor 16 may be directly attached to the manipulator 14.

Here, although the transmission-type sensor 16 provided with the light receiving part 16A and the light receiving part 16B is descried as one example of the mapping sensor, a reflection-type sensor may be used. The mapping sensor may be any sensor, as long as it is capable of detecting the state of the substrate 10. Therefore, the mapping sensor may be a noncontact-type sensor capable of detecting the state of the substrate 10. This mapping sensor is not limited to the optical sensor, but includes a magnetic sensor and an electrostatic capacity sensor, for example. Thus, the mapping sensor is not limited to the transmission-type sensor 16, and the shape of the hand 12 is also not limited to the shape provided with the pair of finger parts 26B and 26C.

Further, in this substrate transferring device 4, although the first mapping position and the second mapping position are set based on the first reference position and the second reference position of the hand 12, it is not limited to this configuration. For example, the inclination of the container 8 may be acquired by making the hand 12 contact the container 8 placed on the table 6, at different positions of the container 8 in the arrayed direction of the substrates 10. Based on the inclination of the container 8, the first mapping position and the second mapping position may be set. Note that, instead of the hand 12, the manipulator 14, other contact implements and contact-type sensors which are attached to the manipulator 14 may contact the container 8. Further, the inclination of the container 8 may be acquired by other noncontact-type sensors.

Although in this substrate transferring device 4 one substrate 10 is taken out at a time from the container 8 by the hand 12, the number of substrates 10 taken out at a time is not limited in particular. A plurality of substrates 10 may be taken out at once from the container 8 by a plurality of other hands arrayed in the arrayed direction of the substrates 10. In this substrate transferring device 4, the inclination of the arrayed direction of the substrates 10 is obtained. By inclining the arrayed direction of the plurality of other hands in accordance with the inclination of the arrayed direction of the substrates 10, the taking-out of the plurality of substrates 10 becomes easier. The inclination of the arrayed direction of the plurality of other hands can be easily implemented by using a manipulator or a table which is provided with a tilt axis.

It is apparent for the person skilled in the art that many improvements or other embodiments of the present disclosure are possible from the above description. Therefore, the above description is to be interpreted only as illustration. The above description is provided in order to teach the person skilled in the art the best mode to implement the present disclosure. The details of the structures and the functions may be changed substantially, without departing from the present disclosure. Various inventions may be formed by a suitable combination of the plurality of components disclosed in this embodiment.

The substrate mapping device, the method of mapping by the same, and the method of teaching the mapping of the present disclosure are widely applicable to mapping of a plurality of substrates arrayed in a container.

What is claimed is:

1. A substrate mapping device configured to map a plurality of substrates inside a container, that is inclined, where the substrates are accommodated so as to be arrayed in a given arrayed direction, comprising:
   a hand that includes a mapping sensor configured to detect a state of the substrate;
   a manipulator that is connected to the hand, the manipulator configured to move the mapping sensor; and
   control circuitry configured to control the manipulator to move the mapping sensor along a mapping course,
   wherein the control circuitry sets a first mapping position that is a lowermost slot of the container and a second mapping position that is an uppermost slot of the container, and sets the mapping course to be a straight-line moving path on which the hand moves in a straight line, that is inclined relative to a front and rear direction of the container, from the first mapping position to the second mapping position.

2. The substrate mapping device of claim 1, wherein the hand has a pair of opposing finger parts,
   wherein the mapping sensor detects the substrate between the pair of finger parts of the hand.

3. A method of mapping substrates by using a substrate mapping device including a hand that includes a mapping sensor configured to detect a state of a substrate, a manipulator that is connected to the hand, the manipulator configured to move the mapping sensor, and a control circuitry configured to control the manipulator to move the mapping sensor along a mapping course, the method comprising:
   (A) placing, on a table, a container where the substrates are accommodated so as to be arrayed, wherein the container is inclined;
   (B) obtaining, by the control circuitry, a first mapping position and a second mapping position different from the first mapping position in a position in an arrayed direction of the substrates in the container placed on the table, wherein the first mapping position is a lowermost slot of the container and the second mapping position is an uppermost slot of the container:
   (C) setting, by the control circuitry, the mapping course to be a straight-line moving path on which the hand moves in a straight line, that is inclined relative to a front and rear direction of the container, from the first mapping position to the second mapping position; and
   (D) mapping, by the control circuitry, the substrates accommodated in the container by moving the mapping sensor along the mapping course.

4. The method of claim 3, wherein the hand is configured to hold the substrate, and
   wherein the obtaining the first mapping position and the second mapping position includes:
      obtaining a first reference position and a second reference position different from the first reference position in a position in the arrayed direction, that are reference positions for the hand to hold the substrate accommodated in the container; and
      calculating the first mapping position based on the first reference position and calculating the second mapping position based on the second reference position.

5. The method of claim 3, wherein the hand has a pair of opposing finger parts, and
   wherein the mapping the substrates includes detecting, by the mapping sensor, a state of the substrate between the pair of finger parts.

6. A method of teaching mapping of substrates by using a substrate mapping device including a hand that includes a mapping sensor configured to detect a state of a substrate, a manipulator that is connected to the hand, the manipulator configured to move the mapping sensor, and a control circuitry configured to control the manipulator to move the mapping sensor along a mapping course, the method comprising:
   (A) placing, on a table, a container where the plurality of substrates are accommodated so as to be arrayed, wherein the container is inclined;
   (B) obtaining, by the control circuitry, a first mapping position and a second mapping position different from the first mapping position in a position in an arrayed direction of the substrates in the container placed on the table, wherein the first mapping position is a lowermost slot of the container and the second mapping position is an uppermost slot of the container; and (C) setting, by the control circuitry, the mapping course to be a straight-line moving path on which the hand moves in a straight line, that is inclined relative to a front and rear direction of the container, from the first mapping position to the second mapping position.

7. The substrate mapping device of claim 2, wherein the mapping sensor is on an upper surface of the pair of finger parts.

* * * * *